United States Patent
Patrick et al.

(10) Patent No.: US 7,190,119 B2
(45) Date of Patent: Mar. 13, 2007

(54) METHODS AND APPARATUS FOR OPTIMIZING A SUBSTRATE IN A PLASMA PROCESSING SYSTEM

(75) Inventors: Roger Patrick, Mountain View, CA (US); Brett Richardson, San Ramon, CA (US); Norman Williams, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 340 days.

(21) Appl. No.: 10/703,843

(22) Filed: Nov. 7, 2003

(65) Prior Publication Data

US 2005/0205532 A1    Sep. 22, 2005

(51) Int. Cl.
*H01J 7/24* (2006.01)
(52) U.S. Cl. ............... 315/111.21; 315/111.51; 315/224; 315/291; 156/345.48; 156/345.44; 118/723 I; 118/723 R
(58) Field of Classification Search ........... 315/111.21, 315/111.51, 111.71, 224, 291, 297, 11.21; 156/345.13, 345.15, 345.44, 345.48; 118/723 R, 118/723 I, 723 E, 723 AN
See application file for complete search history.

(56) References Cited

U.S. PATENT DOCUMENTS

| 5,288,971 | A | * | 2/1994 | Knipp ................... 219/121.57 |
| 5,472,561 | A | * | 12/1995 | Williams et al. .............. 438/10 |
| 5,556,549 | A | * | 9/1996 | Patrick et al. ................ 216/61 |
| 6,265,831 | B1 | * | 7/2001 | Howald et al. ......... 315/111.21 |
| 6,341,574 | B1 | * | 1/2002 | Bailey et al. ............. 118/723 I |
| 6,740,842 | B2 | * | 5/2004 | Johnson et al. ........ 219/121.54 |

OTHER PUBLICATIONS

Jozwiak, Jim, "RF Systems," Semitec 210—RF Energy and Plasma, 10 slides total.
"Patented S Technology," pp. 1-2, http://www.comdel.com/s-tech.htm.
Yang et al., "Power Absorption Characteristics of an Inductively Coupled Plasma Discharge," IEEE Transactions on Plasma Science, vol. 27, No. 3, Jun. 1999, pp. 676-681.
"Application note RF (13.56 MHz) Impedance Matching: Why is impedance matching important," Huettinger Electronic, Inc., 8 pages total.
"6: Plasmas," 5 pages total, http://fpweb.tvi.cc.nm.us/fabian/newpages3.htm.
"CFD-Plasma Manual," 90 pages total, http://www.cfdrc.com/~cfdplasma/Plasmadocs/manual.html, Sep. 22, 2003.

(Continued)

*Primary Examiner*—Haissa Philogene
(74) *Attorney, Agent, or Firm*—IP Strategy Group, PC

(57) ABSTRACT

An arrangement for processing a semiconductor substrate in a plasma processing system is disclosed. The arrangement includes providing a RF coupling structure having a first terminal and a second terminal, the first terminal being coupled with a first electrical measuring device, the second terminal being coupled with a second electrical measuring device. The arrangement also includes coupling a compensating circuit to the second terminal. The arrangement further includes providing a feedback circuit coupled to receive information from the first electrical measuring device and the second electrical measuring device, an output of the feedback circuit being employed to control the compensating circuit in order to keep a ratio between a first electrical value at the first terminal and a second electrical value at the second terminal substantially at a predefined value.

30 Claims, 6 Drawing Sheets

OTHER PUBLICATIONS

"Chapter 4. Characteristics of coplanar a-Si:H TFT's fabricated by ICP-CVD," pp. 64-105.

Lohwasser et al., "High-Efficiency RF Plasma Generation Systems for Ion Source Applications," 3 pages total.

Johnson, David W., "The Transformer Equivalent Circuit from Experiment #9," EGR 325 Electromechanics Technical Paper #2, Apr. 17, 2000, pp. 1-5, http://www.claymore.engineer.gvsu.edu/C~johnsodw/egr325mine/paper2/paper2.html.

Chung et al., "The radio frequency magnetic field effect on electron heating in a low frequency inductively coupled plasma," Physics of Plasmas, vol. 7, No. 9, Sep. 2000, pp. 3584-3587.

Miranda et al., "Impedance modeling of a C12/He Plasma Discharge for Very Large Scale Integrated Circuit Production Monitoring," J. Vac. Sci. Technol. A 14(3), May/Jun. 1996, pp. 1888-1893.

Davis, Frank, "Matching Network Designs with Computer Solutions," Motorola Semiconductor Application Note, AN267/D, 1993, pp. 1-16.

PCT International Search Report, PCT/US04/35980, Mailed Oct. 5, 2005.

PCT Written Opinion, PCT/US04/35980, Mailed Oct. 5, 2005.

* cited by examiner

METHODS AND APPARATUS FOR OPTIMIZING A SUBSTRATE IN A PLASMA PROCESSING SYSTEM

BACKGROUND OF THE INVENTION

The present invention relates in general to substrate manufacturing technologies and in particular to methods and apparatus for optimizing a substrate in a plasma processing system.

In the processing of a substrate, e.g., a semiconductor wafer or a glass panel such as one used in flat panel display manufacturing, plasma is often employed. As part of the processing of a substrate (chemical vapor deposition, plasma enhanced chemical vapor deposition, physical vapor deposition, etc.) for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing parts of the underlying layer to become exposed. The substrate is then placed in a plasma processing chamber on a substrate support structure comprising a mono-polar or bi-polar electrode, called a chuck.

Appropriate plasma processing gases (e.g., $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BCl_3$, $Cl_2$, $WF_6$, etc.) are then flowed into the chamber and ionized by a first RF energy source, commonly coupled to a RF coupling structure, such as a set of induction coils. Additionally, a second RF energy source may also be coupled to the substrate in order to create a bias with the plasma, and direct the plasma away from structures within the plasma processing system and toward the substrate.

The induction coil is a device, similar in purpose to a transformer, that induces a time-varying voltage and potential difference in the plasma processing gases to create a plasma by successively turning the current on and off in the primary coil. A common configuration is to place a planar coil at the top of the chamber, also called the TCP™ (e.g., transformer coupled plasma). Another configuration is to configure the plasma processing system so that a solenoidal coil is wound around the side of the plasma processing chamber.

Plasma is generally comprised of partially ionized gas. Because the plasma discharge is RF driven and weakly ionized, electrons in the plasma are not in thermal equilibrium with ions. That is, while the heavier ions efficiently exchange energy by collisions with the background gas (e.g., argon, etc.), electrons absorb the thermal energy. Because electrons have substantially less mass than that of ions, electron thermal velocity is much greater than the ion thermal velocity. This tends to cause the faster moving electrons to be lost to surfaces within the plasma processing system, subsequently creating positively charged ion sheath between the plasma and the surface. Ions that enter the sheath are then accelerated into the surface.

Lower RF frequencies tend to cause plasma ions to cross the sheath in less than one RF cycle, creating large variations in ion energy. Likewise, higher RF frequencies tend to cause plasma ions take several RF cycles to cross the sheath, creating a more consistent set of ion energies. Higher frequency tends to result in lower sheath voltages than when excited by a lower frequency signal at a similar power level.

Coupled between the RF source and the plasma processing chamber is commonly a matching network. Generally, a matching network transforms the complex impedance of the plasma, as viewed from the transmission line termination, to the nominal output impedance of the RF generator. For example, if an RF generator is delivering an output power of 2 kW (called incident or forward power) and the matching network is not properly "tuned" (resulting, for instance, in 50% reflected power), then 1 kW of power will be reflected back to the RF generator. This means that only 1 kW is delivered to the load (plasma chamber). The combination of a high quality, low impedance, properly selected length transmission line with a properly sized (for current and impedance range) matching network can provide the best power transfer from generator to the plasma chamber.

Referring now to FIG. 1, a simplified diagram of a plasma processing system 100 is shown. Generally, an appropriate set of gases is flowed into chamber 102 through an inlet 108 from gas distribution system 122. These plasma processing gases may be subsequently ionized to form a plasma 110, in order to process (e.g., etch or deposition) exposed areas of substrate 114, such as a semiconductor wafer or a glass pane, positioned on an electrostatic chuck 116. Upper chamber plate 120, along with liner 112, helps to optimally focus plasma 110 onto substrate 114.

Gas distribution system 122 is commonly comprised of compressed gas cylinders 124a–f containing plasma processing gases (e.g., $C_4F_8$, $C_4F_6$, $CHF_3$, $CH_2F_3$, $CF_4HBr$, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a–f may be further protected by an enclosure 128 that provides local exhaust ventilation. Mass flow controllers 126a–f are commonly a self-contained devices (consisting of a transducer, control valve, and control and signal-processing electronics) commonly used in the semiconductor industry to measure and regulate the mass flow of gas to the plasma processing system.

Induction coil 131 is separated from the plasma by a dielectric window 104, and generally induces a time-varying electric current in the plasma processing gases to create plasma 110. The window both protects induction coil from plasma 110, and allows the generated RF field to penetrate into the plasma processing chamber. Further coupled to induction coil 131 at leads 130a–b is matching network 132 that may be further coupled to RF generator 138. As previously described, matching network 132 attempts to match the impedance of RF generator 138, which typically operates at 13.56 MHz and 50 ohms, to that of the plasma 110.

Referring now to FIG. 2, a simplified diagram of a TCP™ induction coil is shown. An induction coil may be fabricated from high conductivity copper tubing—generally circular, rectangular, or square, dependant upon the application, and must be rugged to withstand constant usage. As shown in FIG. 1, leads 130a–b are used to couple induction coil 131 to matching network 132.

As the chamber pressure or power levels change, however, the matching network and load may together become unstable. The result is a rapid fluctuation or jittering that changes faster than the matching network can respond. The resulting power transfer instability can both damage components of the matching network and the RF generator, and substantially affect the production yield of the substrate.

In view of the foregoing, there are desired methods and apparatus for optimizing a substrate in a plasma processing system.

SUMMARY OF THE INVENTION

The invention relates, in one embodiment, to an arrangement for processing a semiconductor substrate in a plasma processing system. The arrangement includes providing a RF coupling structure having a first terminal and a second terminal, the first terminal being coupled with a first electrical measuring device, the second terminal being coupled with a second electrical measuring device. The arrangement also includes coupling a compensating circuit to the second terminal. The arrangement further includes providing a feedback circuit coupled to receive information from the first electrical measuring device and the second electrical measuring device, an output of the feedback circuit being employed to control the compensating circuit in order to keep a ratio between a first electrical value at the first terminal and a second electrical value at the second terminal substantially at a predefined value.

The invention relates, in another embodiment, to an apparatus for processing a semiconductor substrate in a plasma processing system. The apparatus includes a means of providing a RF coupling structure having a first terminal and a second terminal, the first terminal being coupled with a first electrical measuring device, the second terminal being coupled with a second electrical measuring device. The apparatus also includes a means of coupling a compensating circuit to the second terminal. The apparatus further includes a means of providing a feedback circuit coupled to receive information from the first electrical measuring device and the second electrical measuring device, an output of the feedback circuit being employed to control the compensating circuit in order to keep a ratio between a first electrical value at the first terminal and a second electrical value at the second terminal substantially at a predefined value.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
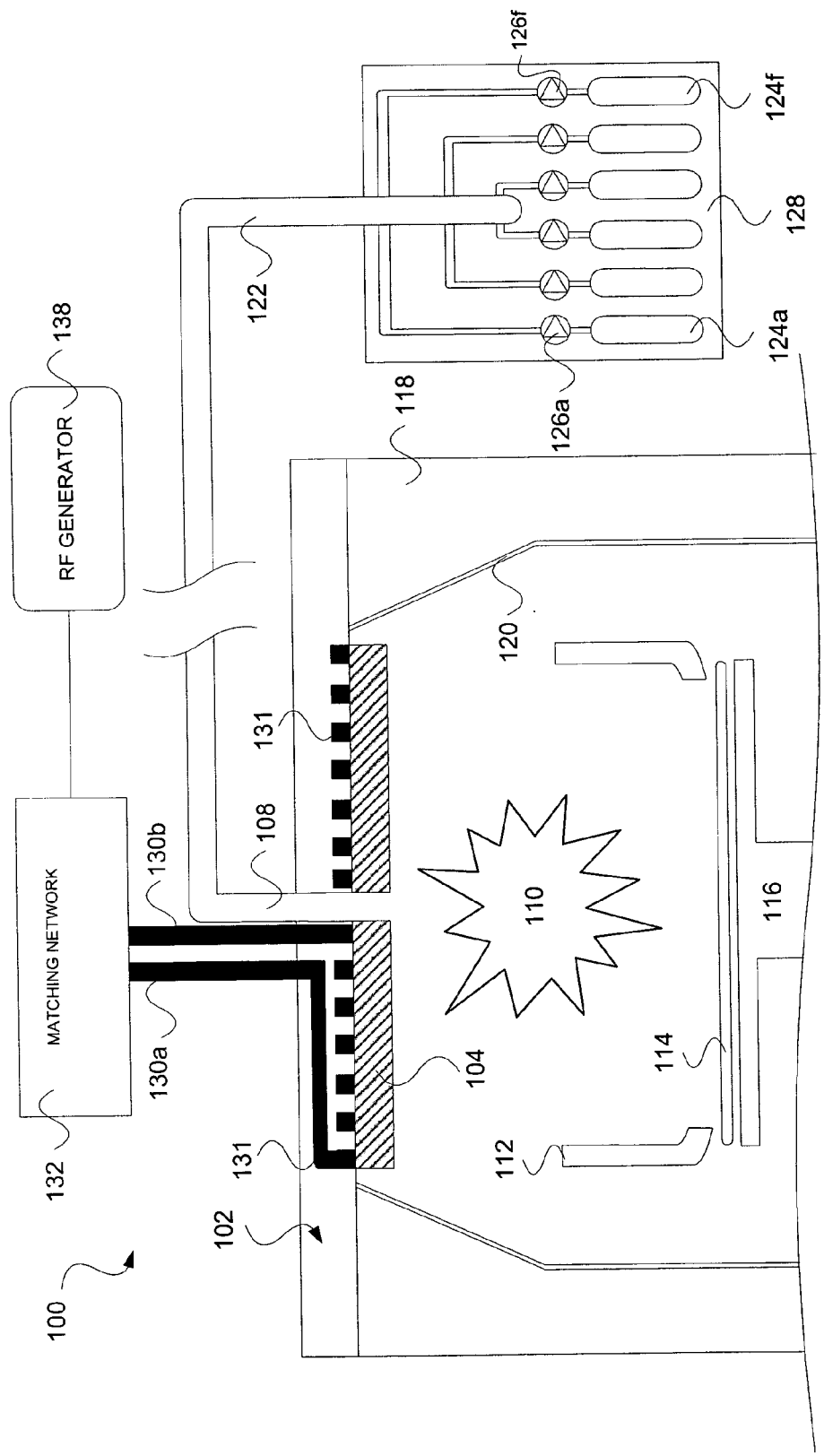
FIG. 1 describes a simplified diagram of a plasma processing system.
Figure 2:
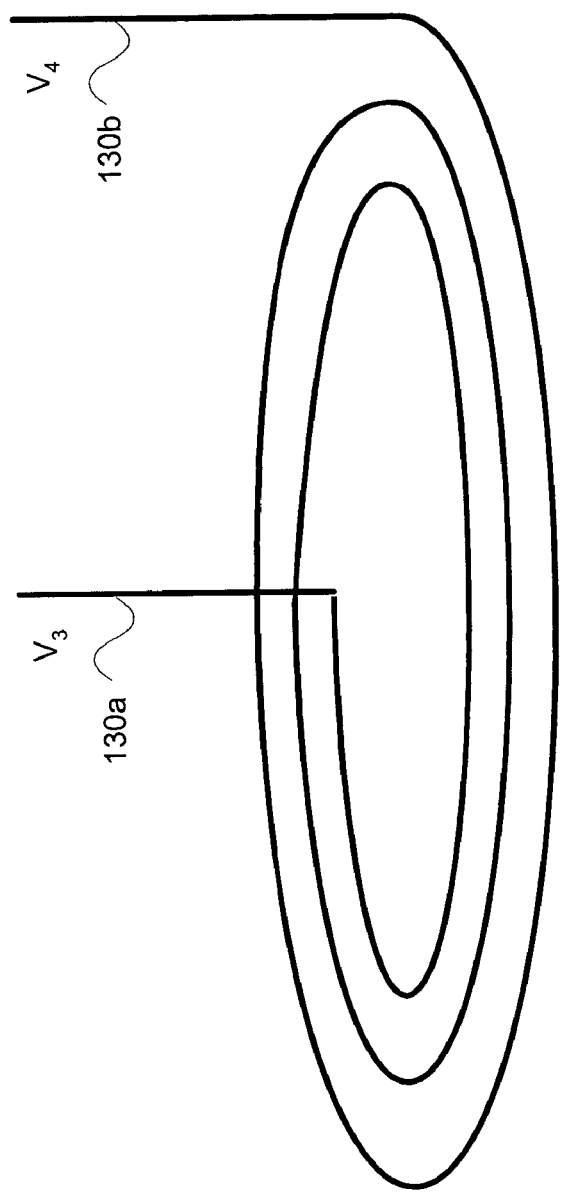
FIG. 2 describes a simplified diagram of a TCP™ induction coil is shown.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that the voltage balance across a RF coupling structure, such as an induction coil, may optimize a plasma in a plasma processing system. For example, a plasma may be generated by an inductively coupled azimuthal electric field produced by an induction coil. Basically a flat antenna, the induction coil is often a spiral coil of rectangular cross-section placed on the top of the dielectric window. Applied voltage to the antenna at 13.56 MHz generates an oscillating magnetic field around the coil, which penetrates into the plasma and produces an azimuthal electric field.

In an ideal plasma processing system, the azimuthal electric field is zero on the axis and zero on the periphery, thereby peaking in an annular region at roughly half the radius. In carefully designed plasma processing systems, the fractional amount of power capacitively-coupled into the plasma from the coil can be small, thereby generating a plasma potential which does not oscillate significantly during the radio-frequency cycle. As previously described, ion energies can be controlled by independently applying a RF potential to create a bias in the substrate.

However, since the plasma load on the matching network may change as the substrate is processed and the plasma consumed, and since a matching network is generally optimized for a predicted plasma load during the manufacture of the plasma processing system, the actual voltage balance across the induction coil may not be optimal for a wide range of process conditions or changing conditions during processing of the substrate. The resulting electric field may become radial distorted which may result in a substantially non-uniform plasma density across the substrate, potentially affecting yield.

This condition becomes even more problematic as requirements for high circuit density on substrates continue to escalate. For example, in a plasma etch process, if the plasma is not properly optimized, faceting may occur. A facet is a non-linear profile of a feature on the substrate, such as with a trench sidewall. A region of low plasma density may not remove a sufficient amount of material from the substrate, subsequently reducing the size of a trench or via. Likewise, a region of high plasma density may remove an excess amount of material from the substrate subsequently creating a cavernous undercut.

Figure 3:
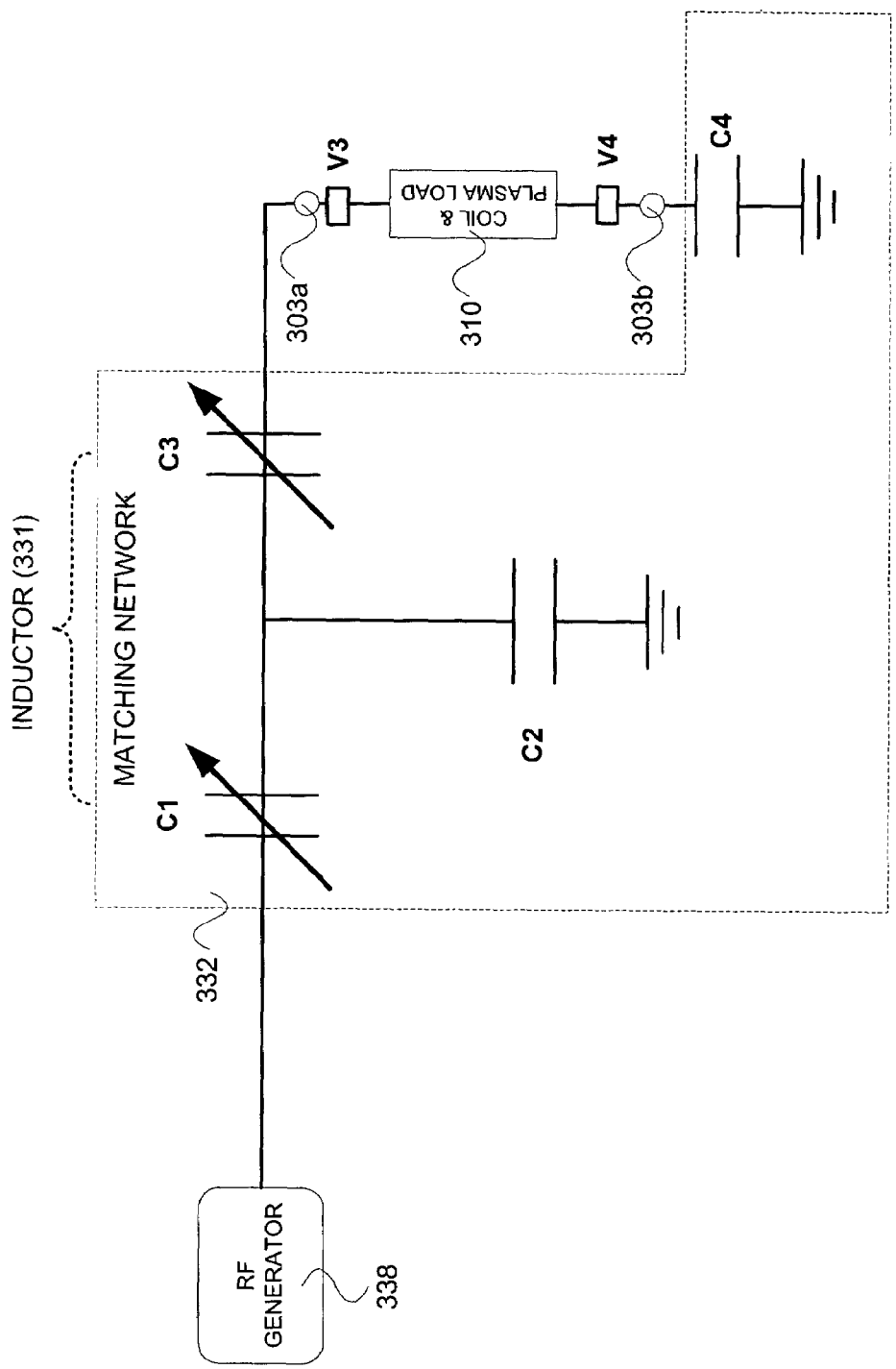
FIG. 3 describes a simplified diagram a matching network is shown, according to one embodiment of the invention.

Referring now to FIG. 3, a simplified electrical diagram of a matching network is shown, according to one embodiment of the invention. In general, measuring electrical characteristics, such as voltage, through electrical measuring devices coupled to an induction coil, such as a voltage probe, may not provide sufficient information to deduce delivered power or impedance. Subsequently, in a non-obvious manner, a model of the match network was developed to predict the load impedance from the matching network settings. From the deduced load impedance, the delivered power may be estimated since the voltages on the coil are known. The values of power, deduced in this manner, are accurate to about 9%.

A detailed model of a matching network 332 may include not only the visible components, such as vacuum capacitors, but also the inductance of every connection between components. The currents flowing in these connections induce currents elsewhere, especially in the walls of the match network enclosure. These induced currents form part of the complex current return path to the RF generator. Resistive losses in the walls contribute to the effective resistance of the match network.

However, such a model would be quite complex and contain a large number of elements, making it difficult to quantify each of them. A simpler approach models the matching network as a set of lumped components only. For example, inductor 331 corresponds to the connection between variable capacitor C1 and C3 which may be about 15 inches long. It is assumed to have an inductance of about 100 nH. The remaining connections are only a few inches long and are neglected. All of the elements beyond C3 are considered to be part of plasma load 310 (e.g., induction coil, plasma, substrate, etc.) The leads 303a–b connecting the ends of the TCP™ coil are, together, about 12 inches long, and are part of the load impedance.

Each vacuum capacitor may have an intrinsic series inductance of about 20 nH, but these are not specifically included. This series inductance is not detected when the capacitors are calibrated at a frequency of 1 kHz, and is only just noticeable at the operating frequency of 13.56 MHz. Induced currents in the network housing tend to reduce the effective inductance of the component causing the induction. These can be taken into account by an empirical choice of inductance to best fit the data.

The resistance of the match network is assumed to be small, so that the conjugate impedance method may be used to calculate the load impedance from the capacitor settings. The capacitors C1 and C3 are calibrated versus counts and a typical calibration curve is shown from which the capacities can be readily determined. Their values may range from about 28 pF to 480 pF in this particular network. The capacitors C2 and C4 are fixed at their standard values of 102 and 80 pF corresponding to the 200 mm STAR configuration.

V3 and V4 are electrical measuring devices, such as a RF voltage probe, located near to each end of the induction coil that in turn, supplies inductive RF power to the plasma chamber. Electrical measuring device V3 may measure a first voltage, between the matching network and the induction coil, while electrical measuring device V4 measures a second voltage between the load and the terminating capacitor C4. In one embodiment, the electrical measuring devices are similar in design to RF voltage peak detector. In general, the voltage probe permits RF voltages as high as 5 kV (peak) to be measured without arcing or other discharge. Generally the absolute accuracy of the probes is estimated at about 3% from about 200 V to about 5 kV.

Figure 4:
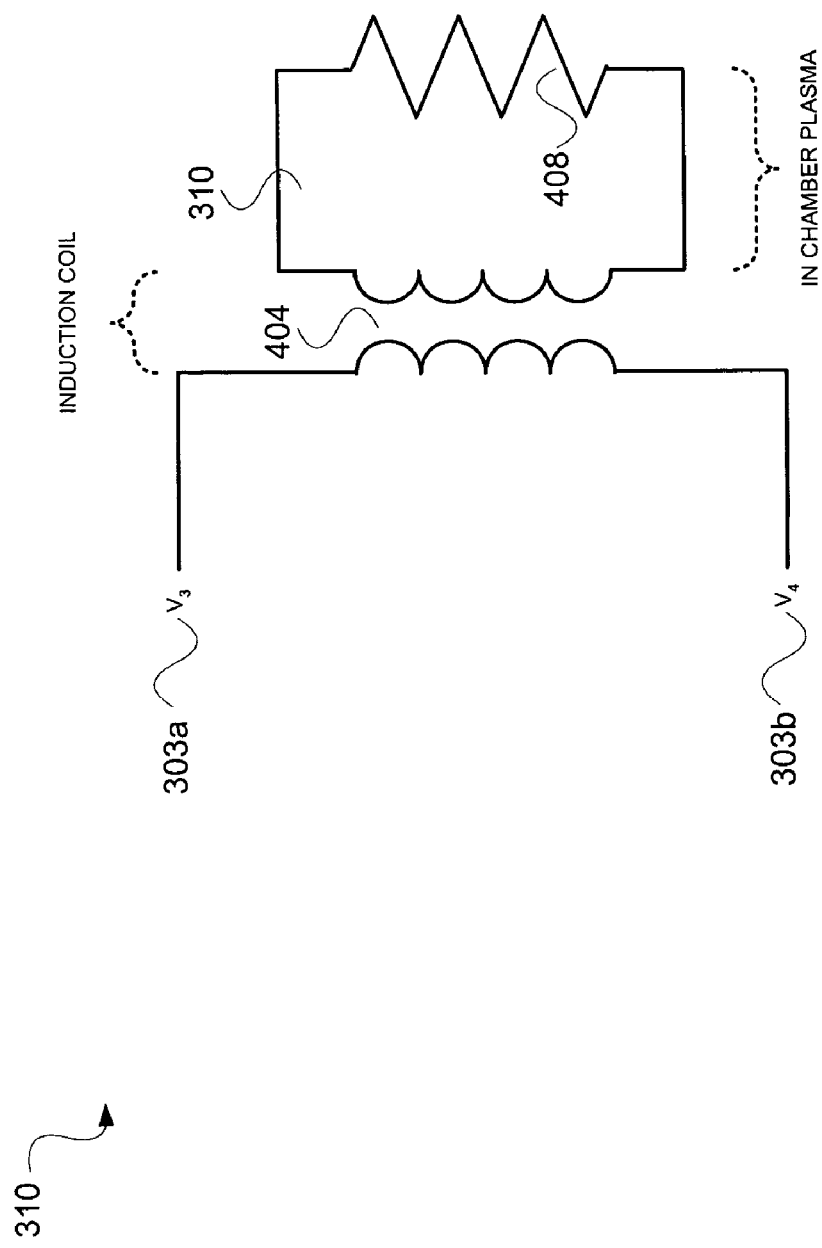
FIG. 4 describes a simplified model of plasma load 310 is shown, according to one embodiment of the invention.

Referring now to FIG. 4, a simplified model of the coil and plasma load 310 is shown, according to one embodiment of the invention. In general, the coil and plasma load 310 comprises plasma processing system elements that are electrically between V3 and V4 (e.g., induction coil, plasma, substrate, etc). Like the matching network, the coil and plasma load 310 may be modeled as a transformer circuit comprising a parallel resistance 408 representing the core power loss of the plasma, and a parallel inductance 404, which accounts for the coupling of magnetic flux to the plasma.

Figure 5:
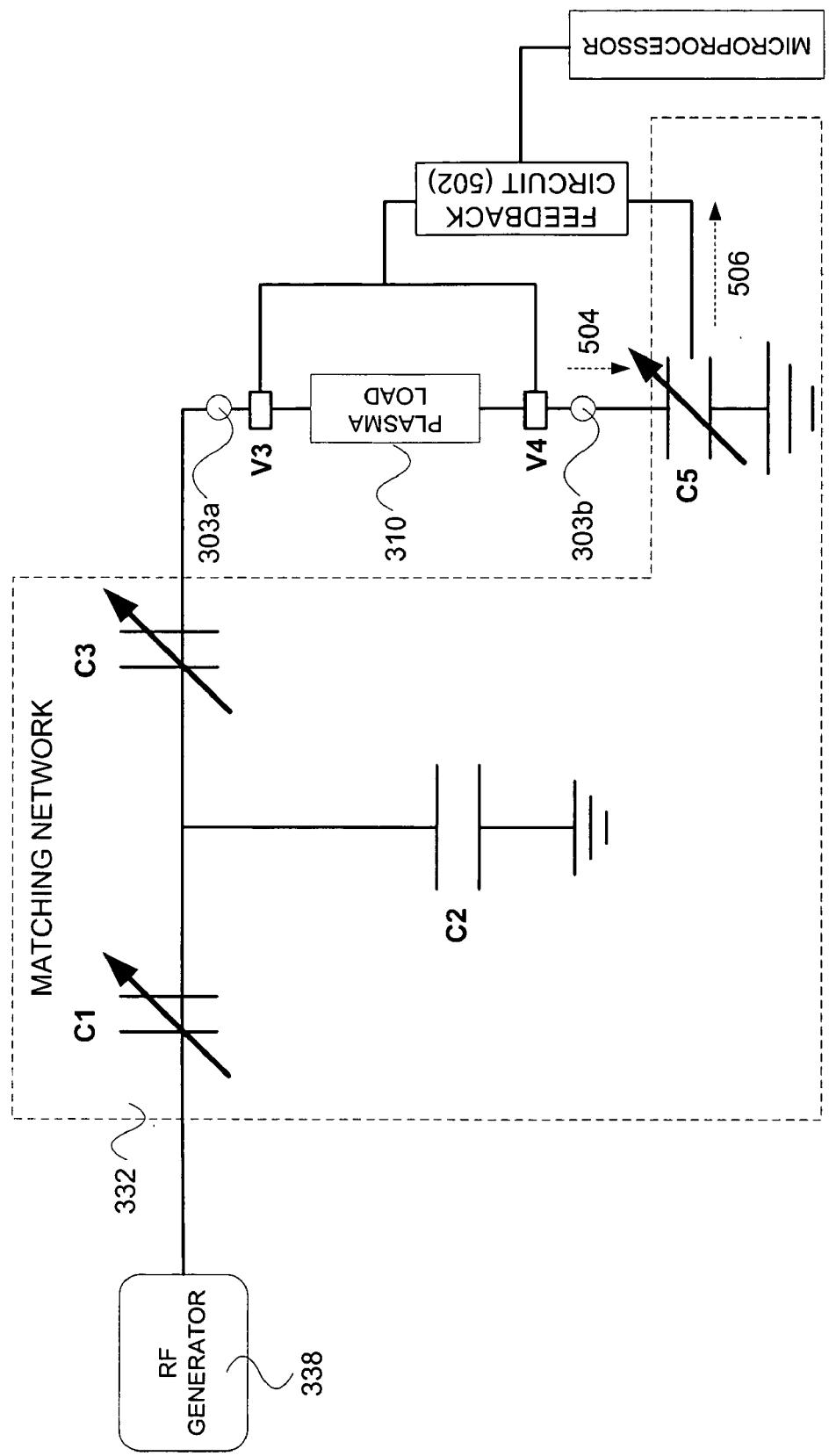
FIG. 5 describes a simplified electrical diagram of a matching network is shown in which induction coil voltage is substantially optimized and balanced, according to one embodiment of the invention.

Referring now to FIG. 5, a simplified electrical diagram of a matching network is shown in which induction coil voltage is substantially optimized and balanced, according to one embodiment of the invention. In a non obvious fashion, a feedback circuit is coupled between V3 and V4, and with compensating circuit C5, such as a variable capacitor, in order to adjust the ratio of the first voltage to the second voltage. In an embodiment, the feedback circuit is microprocessor controlled. In an embodiment, the compensating circuit and the feedback circuit are integrated.

As in FIG. 3, a simplified model of the matching network is shown as a set of lumped components only, according to one embodiment of the invention. Inductor 331 corresponds to the connection between C1 and C3. All of the elements beyond C3 are considered to be part of the coil and plasma load 310 (e.g., induction coil, plasma, substrate, etc.) The leads 303a–b connecting the ends of the TCP™ coil are part of the load impedance. V3 and V4 are located near to each end of the induction coil that in turn, supplies inductive RF power to the plasma chamber. V3 measures a first voltage between the matching network and the induction coil, while V4 measures a second voltage between the load and the terminating capacitor, C5.

Feedback circuit 502 is a circuit that comprises a signal path which includes a forward path 504, a feedback path 506, and is coupled to the capacitor, C5. In a non-obvious fashion, feedback circuit 502 optimizes induction coil voltage, in a substantially dynamic manner, as the substrate is processed and the plasma consumed. In one embodiment, C5 is motorized. In another embodiment, feedback circuit 502 may then adjust C5 during substrate processing in order to keep the first voltage and second voltage substantially in balance. In yet another embodiment, the feedback circuit can adjust the ratio of the first voltage to the second voltage to any desired value K in order to provide a plasma processing benefit, such as tuning etch uniformity. In another aspect of the invention, a preferable range of the ratio K is between about 0.5 and about 1.5. In another aspect of the invention, a more preferable range of the ratio K is between about 0.75 and about 1.25. In another aspect of the invention, the most preferable range of the ratio K is about 1.

Figure 6:
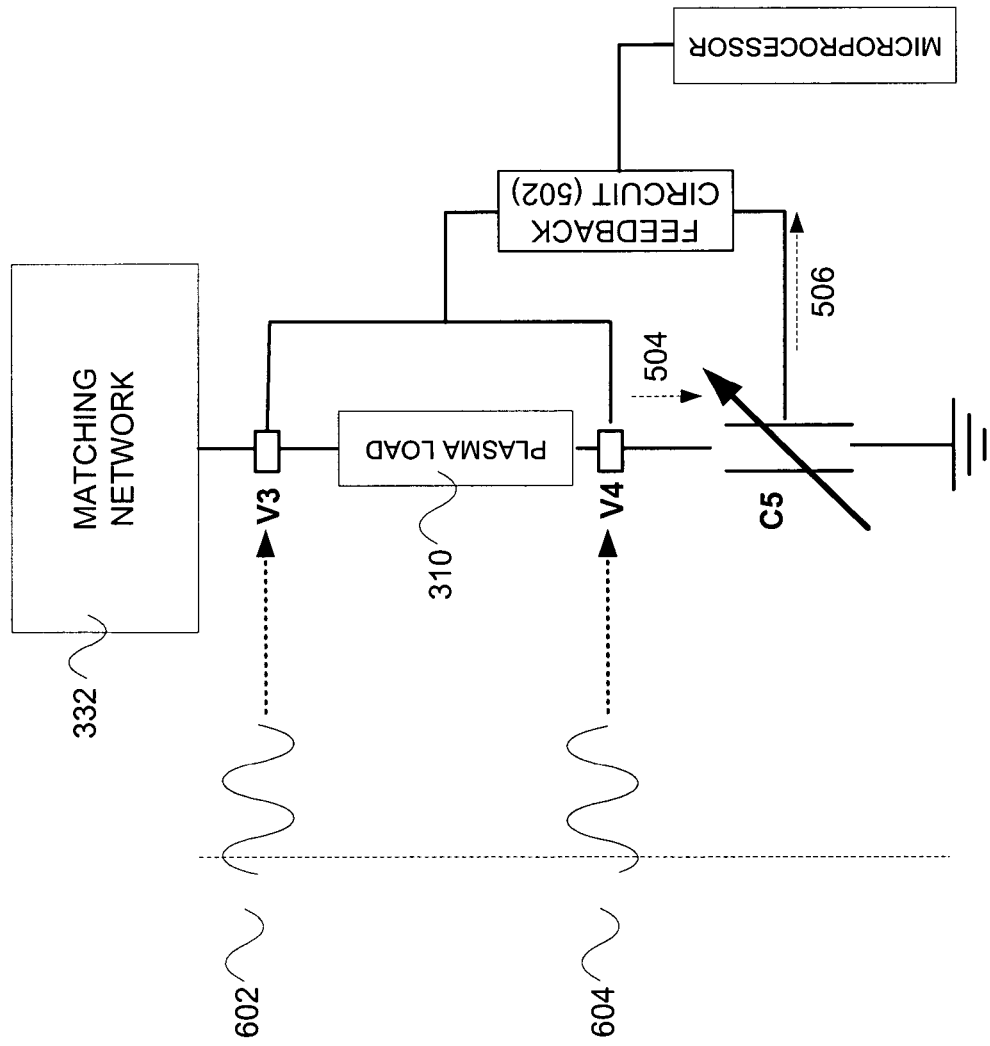
FIG. 6 describes a portion of the matching network of FIG. 5, in which voltage amplitude is balanced, according to one embodiment of the invention.

Referring now to FIG. 6, a portion of the matching network of FIG. 5 is shown in which voltage amplitude is balanced, according to one embodiment of the invention. While not wishing to be bound by theory, it is believed by the inventor herein that the optimum balance configuration is for the phase of the second voltage to be at 180° to the first voltage. In general, when the voltage phases of two RF powers are almost the same, the plasma spreads, decreasing density and hence process speed. However, when a voltage phase difference is about 180 degrees, the plasma density tends to be substantially higher. In an embodiment, the feedback circuit is microprocessor controlled. In an embodiment, the compensating circuit and the feedback circuit are integrated.

Matching network 332 transforms the complex impedance of the plasma, as viewed from the transmission line termination, to about a stable 50 ohms and frequency of about 13.56 MHz, as previously described. Feedback circuit 502 monitors the voltage at V3 and V4 via feedback path 506, and adjusts C5 in order to insure that the coil and plasma load 310 is optimized, the voltage value at V3 is substantially the same as the voltage value at V4, but with a phase 602 that is about 180° to phase 604. In another embodiment, feedback circuit 502 is further coupled to a diagnostic monitoring apparatus. For example, if measured voltage or impedance values fall outside pre-determined process ranges, a warning message may be sent to a preventive maintenance system for further investigation.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used.

This invention may also be used with substrates of various diameters (e.g., 200 mm, 300 mm, etc.). Also, other electrical components may be used in place of a variable capacitor, such as a variable inductor, etc. In addition, an electrical measuring device, as described herein, may measure electrical characteristics other than voltage, such as current, impedance, etc. It should also be noted that there are many alternative ways of implementing the methods of the present invention.

Advantages of the invention include methods and apparatus for optimizing a substrate in a plasma processing system. Additional advantages include optimizing plasma density throughout the plasma process and providing diagnostic information for preventive maintenance.

Having disclosed exemplary embodiments and the best mode, modifications and variations may be made to the disclosed embodiments while remaining within the subject and spirit of the invention as defined by the following claims.

What is claimed is:

1. A method for processing a semiconductor substrate in a plasma processing system, comprising:
    providing a RF coupling structure having a first terminal and a second terminal, said first terminal being coupled with a first electrical measuring device, said second terminal being coupled with a second electrical measuring device;
    coupling a compensating circuit to said second terminal; and
    providing a feedback circuit coupled to receive information from said first electrical measuring device and said second electrical measuring device, an output of said feedback circuit being employed to control said compensating circuit in order to keep a ratio between a first electrical value at said first terminal and a second electrical value at said second terminal substantially at a predefined value.

2. The method of claim 1, wherein said first electrical value is voltage.

3. The method of claim 1, wherein said first electrical value is current.

4. The method of claim 1, wherein said second electrical value is voltage.

5. The method of claim 1, wherein said second electrical value is current.

6. The method of claim 1, wherein said compensating circuit is a variable capacitor.

7. The method of claim 1, wherein said compensating circuit is a variable inductor.

8. The method of claim 1, wherein said compensating circuit and said feedback circuit are integrated.

9. The method of claim 1, wherein said compensating circuit is coupled to ground.

10. The method of claim 1, wherein said first terminal is coupled to a matching network.

11. The method of claim 1, wherein said matching network is coupled to a RF generator.

12. The method of claim 1, wherein said predefined value is between about 0.5 and about 1.5.

13. The method of claim 1, wherein said predefined value is about 0.75 and about 1.25.

14. The method of claim 1, wherein said predefined value is about 1.

15. The method of claim 1, wherein said feedback circuit is microprocessor controlled.

16. An apparatus for processing a semiconductor substrate in a plasma processing system, comprising:
    a means of providing a RF coupling structure having a first terminal and a second terminal, said first terminal being coupled with a first electrical measuring device, said second terminal being coupled with a second electrical measuring device;
    a means of coupling a compensating circuit to said second terminal; and
    a means of providing a feedback circuit coupled to receive information from said first electrical measuring device and said second electrical measuring device, an output of said feedback circuit being employed to control said compensating circuit in order to keep a ratio between a first electrical value at said first terminal and a second electrical value at said second terminal substantially at a predefined value.

17. The apparatus of claim 16, wherein said feedback circuit is microprocessor controlled.

18. The apparatus of claim 16, wherein said first electrical value is voltage.

19. The apparatus of claim 16, wherein said first electrical value is current.

20. The apparatus of claim 16, wherein said second electrical value is voltage.

21. The arrangement of claim 16, wherein said second electrical value is current.

22. The apparatus of claim 16, wherein said compensating circuit is a variable capacitor.

23. The apparatus of claim 16, wherein said compensating circuit is a variable inductor.

24. The apparatus of claim 16, wherein said compensating circuit and said feedback circuit are integrated.

25. The apparatus of claim 16, wherein said compensating circuit is coupled to ground.

26. The apparatus of claim 16, wherein said first terminal is coupled to a matching network.

27. The apparatus of claim 16, wherein said matching network is coupled to a RF generator.

28. The apparatus of claim 16, wherein said predefined value is between about 0.5 and about 1.5.

29. The apparatus of claim 16, wherein said predefined value is about 0.75 and about 1.25.

30. The apparatus of claim 16, wherein said predefined value is about 1.

* * * * *